US008687827B2

(12) United States Patent
Chen et al.

(10) Patent No.: US 8,687,827 B2
(45) Date of Patent: Apr. 1, 2014

(54) MICRO-ELECTRO-MECHANICAL SYSTEM MICROPHONE CHIP WITH EXPANDED BACK CHAMBER

(75) Inventors: Hung-Jen Chen, Taichung (TW); Kuan-Hsun Chiu, Taichung (TW); Chun-Chieh Wang, Taichung (TW); Ming-Li Hsu, Taichung (TW)

(73) Assignee: Merry Electronics Co., Ltd., Taichung (TW)

( * ) Notice: Subject to any disclaimer, the term of this patent is extended or adjusted under 35 U.S.C. 154(b) by 0 days.

(21) Appl. No.: 13/482,350

(22) Filed: May 29, 2012

(65) Prior Publication Data

US 2013/0322661 A1 Dec. 5, 2013

(51) Int. Cl.
*H04R 25/00* (2006.01)
*H01L 29/84* (2006.01)

(52) U.S. Cl.
USPC .......................................... 381/175; 257/415

(58) Field of Classification Search
USPC .................................. 381/174, 175; 257/415
See application file for complete search history.

(56) References Cited

U.S. PATENT DOCUMENTS

| | | | | |
|---|---|---|---|---|
| 7,023,066 B2 * | 4/2006 | Lee et al. | ...................... | 257/415 |
| 7,795,063 B2 * | 9/2010 | Hsieh et al. | ...................... | 438/53 |
| 7,940,944 B2 * | 5/2011 | Song | ...................... | 381/174 |
| 8,237,235 B2 * | 8/2012 | Wu et al. | ...................... | 257/414 |
| 2007/0059938 A1 * | 3/2007 | Kida et al. | ...................... | 438/710 |
| 2011/0198714 A1 * | 8/2011 | Yang | ...................... | 257/416 |

* cited by examiner

*Primary Examiner* — Brian Ensey
(74) *Attorney, Agent, or Firm* — Muncy, Geissler, Olds & Lowe, P.C.

(57) ABSTRACT

A MEMS microphone chip with an expanded back chamber includes a first chip unit and a second chip unit. The first chip unit has a first substrate, a vibration membrane layer is formed above an end of the first substrate, and a space is formed below the vibration membrane layer of the first substrate, so that the vibration membrane layer is suspended above the first substrate to vibrate. The second chip unit has a second substrate to couple with another end of the first substrate, and a groove is formed in the second substrate with a width larger than that of the space; when the first substrate and the second substrate are coupled together, the groove and the space are connected together to act as the back chamber of the vibration membrane layer.

9 Claims, 8 Drawing Sheets

MICRO-ELECTRO-MECHANICAL SYSTEM MICROPHONE CHIP WITH EXPANDED BACK CHAMBER

BACKGROUND OF THE INVENTION

1. Field of Invention

The present invention relates to micro-electro-mechanical system (MEMS) microphone chip and more particularly to a MEMS microphone chip with an expanded back chamber.

2. Related Art

In the wake of rapid development of semi-conductor technology, electronic products are becoming slimmer and more compact in design than ever before. The integration of microphones in semi-conductor industry to convert sound waves into electronic signals is the faster developing technology in the electroacoustic field. Many electronic products found in the market today are installed with MEMS microphones, which are more heat-resistant, anti-vibrational, and radio frequency interference (RFI) resistant than conventional electret condenser microphones (ECM) which are more widely used. Because of its better heat-resistant characteristic, the MEMS microphone can be manufactured by automatic surface mount technology (SMT), therefore production procedures are simplified, production costs are reduced, free designs are allowed and system costs are reduced.

Referring FIG. 1, it shows a cross-sectional view of a conventional MEMS microphone chip. The conventional MEMS microphone chip is formed in this way: A silicon oxide insulating layer 11 and a silicon nitride insulating layer 12 are formed on a silicon base plate 10 by microelectromechanical manufacturing process; a vibration membrane layer 13 and an electrode 14 are formed on the silicon nitride insulating layer 12, and a conducting wire 15 is connected between the vibration membrane layer 13 and the electrode 14; furthermore, a chamber 16 is formed in the silicon base plate 10 by etching, so that the vibration membrane layer 13 is suspended on the silicon nitride insulating layer 12; the conventional MEMS microphone chip can be disposed on a bottom plate, and connected electrically to a semi-conductor chip (ASIC-Application Specific Integrated Circuit) on the same bottom plate; then a MEMS microphone is formed and assembled after the bottom plate is fitted with an outer case with sound holes. The vibration membrane layer 13 vibrates in response to external sound waves which are transmitted to the MEMS microphone chip through the sound holes; then an electronic signal is correspondingly produced and is transmitted to the semi-conductor chip via the electrode 14, it is then output to a processor of an electronic product installed with the MEMS microphone.

The space of the chamber 16 formed in the silicon base plate 10 is very small because of a micro-size of the MEMS microphone chip, thus the vibration force of the vibration membrane layer 13 is reduced due to the air resistance produced by the limited space of the chamber 16. This causes the deterioration of sound quality of the MEMS microphone, especially in terms of sensitivity. Furthermore, in a process of putting adhesive on the abovementioned conventional MEMS microphone chip to be coupled to the bottom plate, the opening of the chamber 16 has to be avoided, therefore it is rather troublesome in manufacturing and the time cost will be increased.

SUMMARY OF THE INVENTION

In order to tackle the problems mentioned above, an object of the present invention is to provide a MEMS microphone chip with which a back chamber can be expanded.

In order to achieve the above mentioned object, a MEMS microphone chip with an expanded back chamber of the present invention comprises a first chip unit and a second chip unit. The first chip unit has a first substrate, a vibration membrane layer is formed above an end of the first substrate, and a space is formed below the vibration membrane layer of the first substrate, so that the vibration membrane layer is suspended above the first substrate to vibrate. The second chip unit has a second substrate to couple with another end of the first substrate, and a groove is formed in the second substrate with a width larger than that of the space. When the first substrate and the second substrate are coupled together, the groove and the space are connected together to act as the back chamber of the vibration membrane layer.

In view of the abovementioned, according to a MEMS microphone chip with an expanded chamber of the present invention, by forming of the space and the groove in the two chip units respectively, so that the space and the groove are connected with each other when the two chip units are coupled together in order to form the chamber of the vibration membrane layer; and by having the width of the groove larger than that of the space so that the chamber is expanded. Thereby a sensitivity of the MEMS microphone chip is enhanced and an overall performance of the MEMS microphone can also be enhanced.

The present invention will become more fully understood, by reference to the following detailed description thereof when read in conjunction with the attached drawings.

DETAILED DESCRIPTION OF THE INVENTION

The following description of a preferred embodiment is referring to the accompanying drawings to exemplify a specific practicable embodiment of a MEMS microphone chip with an expanded back chamber of the present invention.

Figure 1:
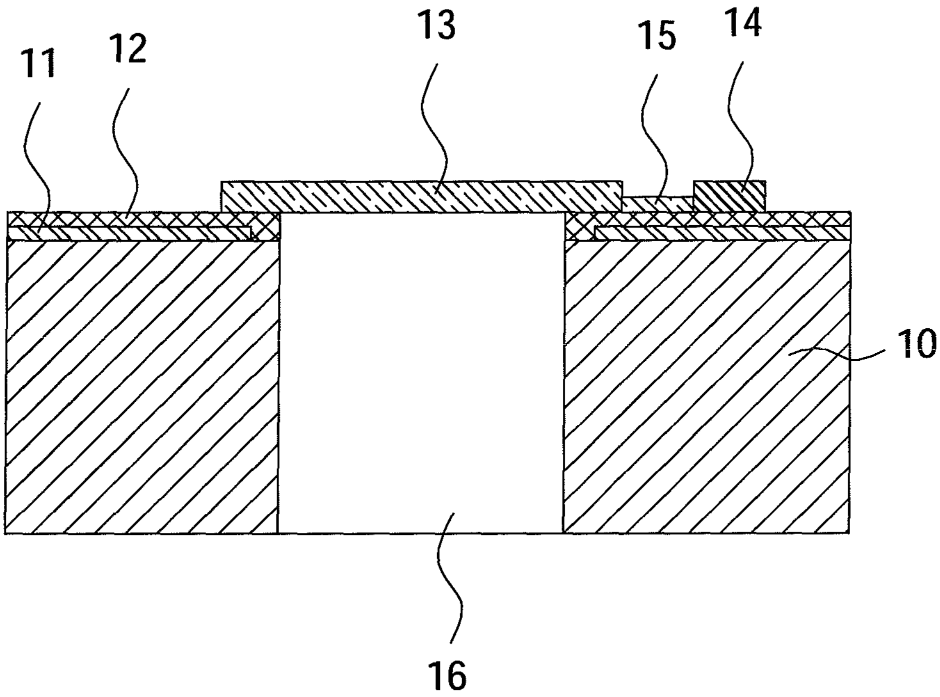
FIG. 1 is a cross-sectional view of a conventional MEMS microphone chip;.
Figure 2:
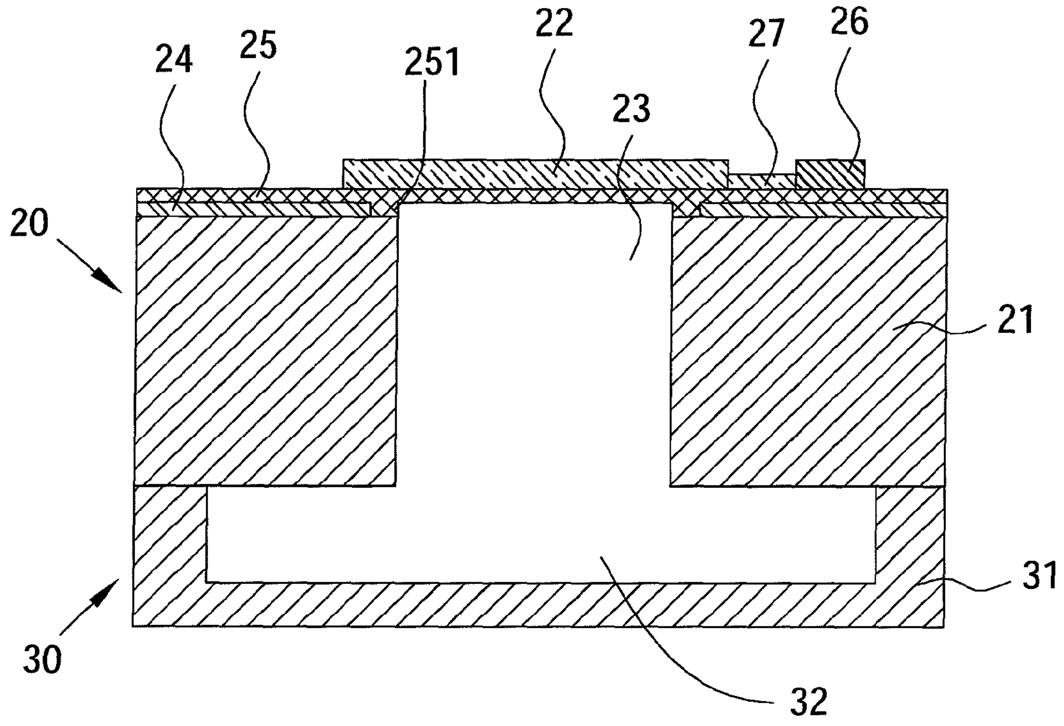
FIG. 2 is a cross-sectional view of a MEMS microphone chip of the present invention.

Referring to FIG. 2, it is a cross-sectional view of a MEMS microphone chip of the present invention. The MEMS microphone chip comprises a first chip unit 20 and a second chip unit 30. The first chip unit 20 has a first substrate 21, a vibration membrane layer 22 is formed above a first end of the first substrate 21, and a space 23 is formed below the vibration membrane layer 22 of the first substrate 21, so that the vibration membrane layer 22 is suspended above the first substrate 21 to vibrate. The second chip unit 30 has a second substrate 31 to couple with a second end of the first substrate 21. In addition, a groove 32 is formed in the second substrate 31 and a width of the groove 32 is larger than that of the space 23. When the first substrate 21 and the second substrate 31 are coupled together, the groove 32 and the space 23 are connected together to act as a back chamber of the vibration membrane layer 22.

The same as described above for a conventional one, a MEMS microphone chip of the present invention can be disposed on a bottom plate, and connected electrically to a semi-conductor chip on the bottom plate. After the bottom plate is fitted with an outer case with sound holes, then the MEMS microphone is assembled and formed. The vibration membrane layer 22 vibrates in corresponding to the back chamber in response to external sound waves, and an electronic signal is correspondingly produced to be transmitted to the semi-conductor chip. Then it is transmitted to a processor of an electronic product installed with the MEMS microphone. Because of the additionally disposed groove 32 of the MEMS microphone chip of the present invention, the vibration membrane layer 22 is less affected by air resistance and thus a better sensitivity can be provided.

Referring to FIG. 2, a first insulating layer 24 and a second insulating layer 25 are further included between the first substrate 21 and the vibration membrane layer 22. The vibration membrane layer 22 is supported on the second insulating layer 25, and boundary columns 251 are extended from the second insulating layer 25 to dispose in the first insulating layer 24. An. electrode 26 is further disposed above the first substrate 21, the electrode 26 is electrically connected to the vibration membrane layer 22 by a conducting wire 27, and the electrode 26 is used for electrically connecting to an external semi conductor chip.

In the following, please, refer to FIGS. 3 to 5, they show a manufacturing process of a MEMS microphone chip of the present invention. The manufacturing process of the MEMS microphone chip of the present invention includes: depositing a first substrate; forming a vibration membrane layer on the first substrate; etching a space on the first substrate so that the vibration membrane layer is disposed and suspended above the first substrate; deposing a second substrate; etching a groove in the second substrate with a width of the groove wider than that of the space; and coupling the first substrate and the second substrate, so that the groove and the space are connected together to act as a back chamber of the vibration membrane layer.

Figure 3:
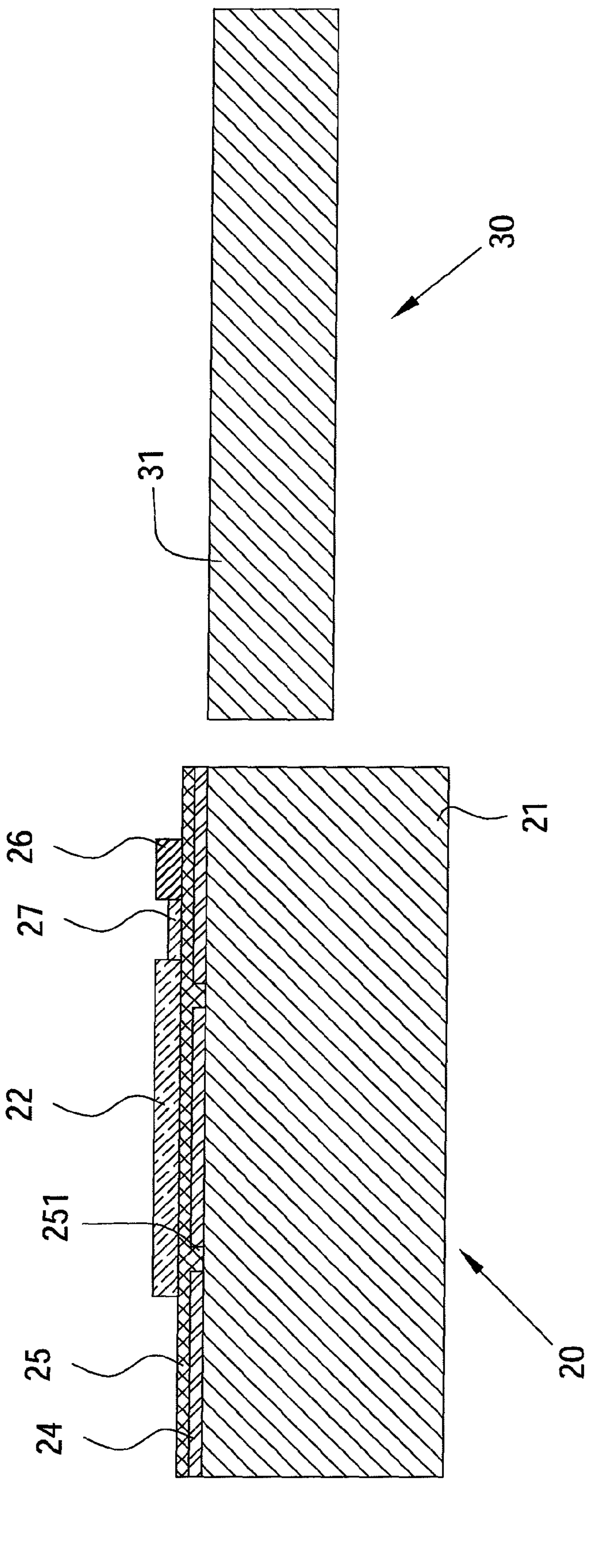
FIG. 3 is a first schematic view of a manufacturing process of a MEMS microphone chip of the present invention.

Referring to FIG. 3, the first substrate 21 and the second substrate 31 are formed separately by deposition of silicon; the first insulating layer 24 is deposited on the first substrate 21; the second insulating layer 25 is deposited on the first insulating layer 24; the boundary columns 251 are extended from the second insulating layer 25 to dispose in the first insulating layer 24; then the vibration membrane layer 22, the electrode 26 and the conducting wire 27 are formed on the second insulating layer 25. Furthermore, the first insulating layer 24 is formed by deposition of silicon dioxides; the second insulating layer 25 is formed by deposition of silicon nitrides; the conducting wire 27 and the electrode 26 can be made of metals with characteristic of electrical conduction.

Figure 4:
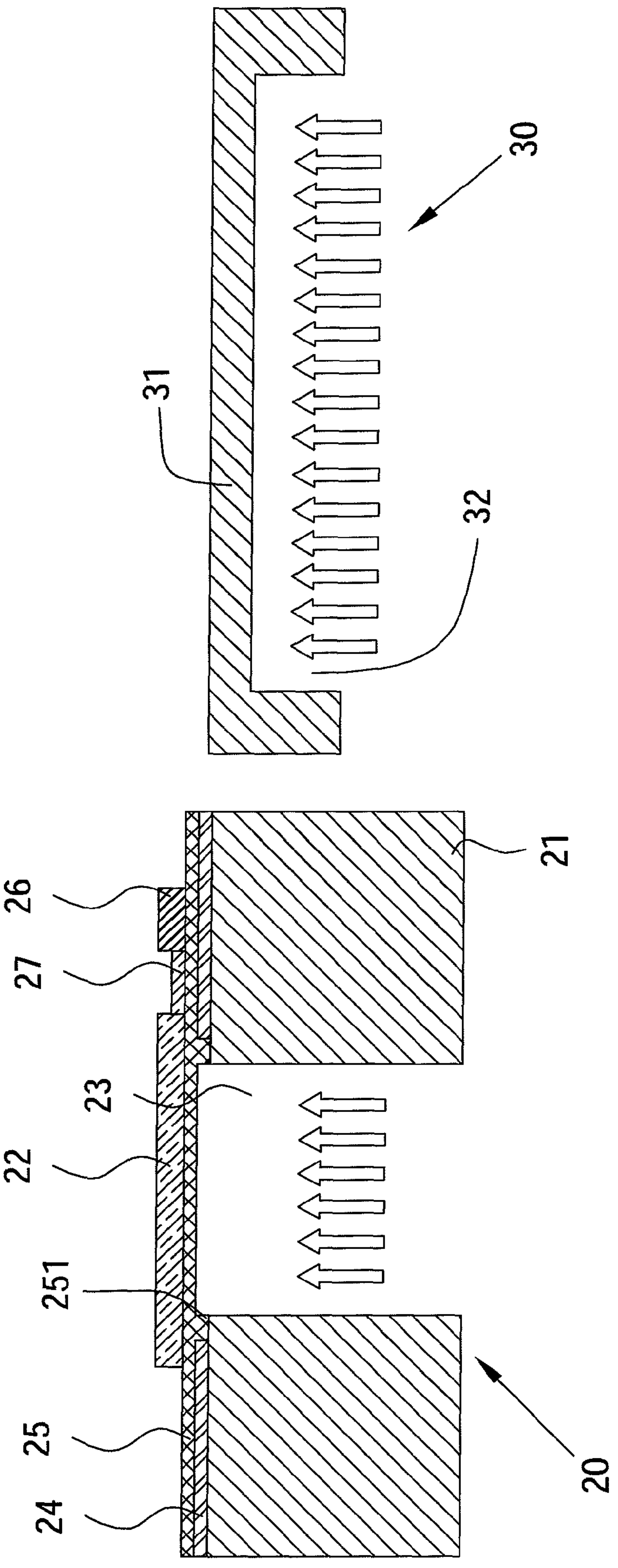
FIG. 4 is a second schematic view of a manufacturing process of a MEMS microphone chip of the present invention.
Figure 5:
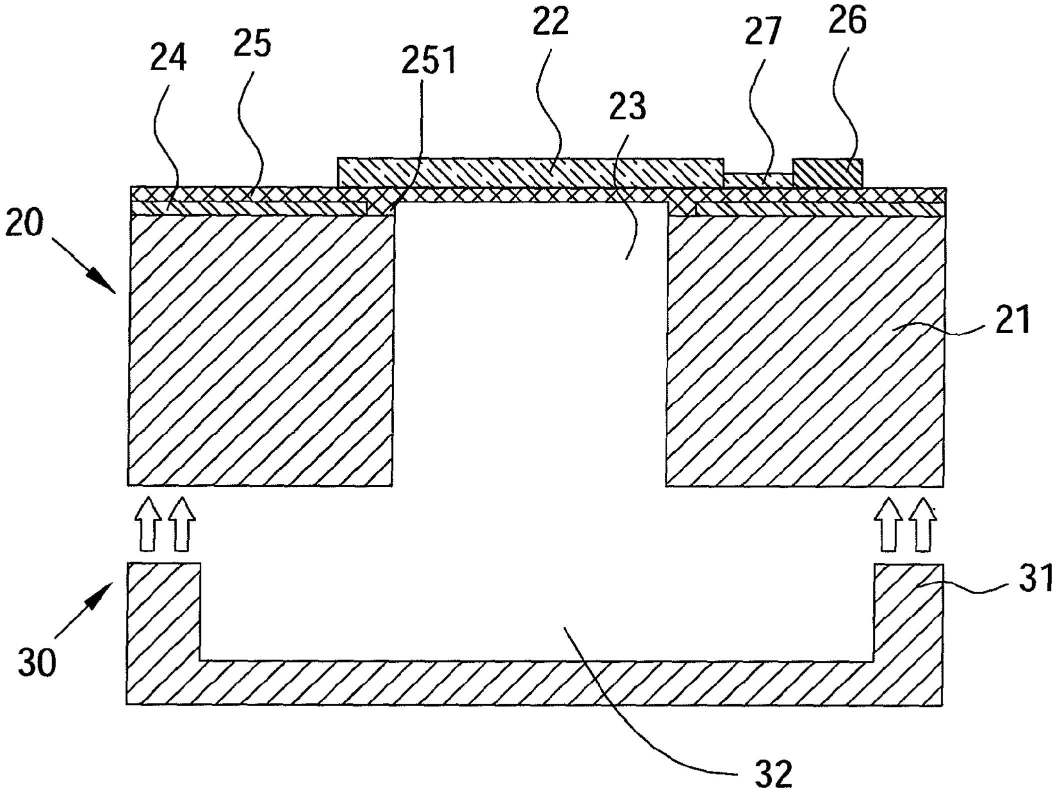
FIG. 5 is a third schematic view of a manufacturing process of a MEMS microphone chip of the present invention.

Referring to FIG. 4, the first substrate 21 and the second substrate 31 are treated by dry etching, so that the space 23 can be formed in the first substrate 21, and the groove 32 can be formed in the second substrate 31. When the first substrate 21 is processed by etching, because of the first insulating layer 24 and the second insulating layer 25 being made of different materials, thus the first substrate 21 and the first insulating layer 24 can be etched by plasma which can only have an etching effect on the first substrate 21 and first insulating layer 24. Because of the disposing of the boundary columns 251 of the second insulating layer 25, when the first insulating layer 24 is processed by etching, only an area between the two boundary columns 251 is etched.

Figure 6:
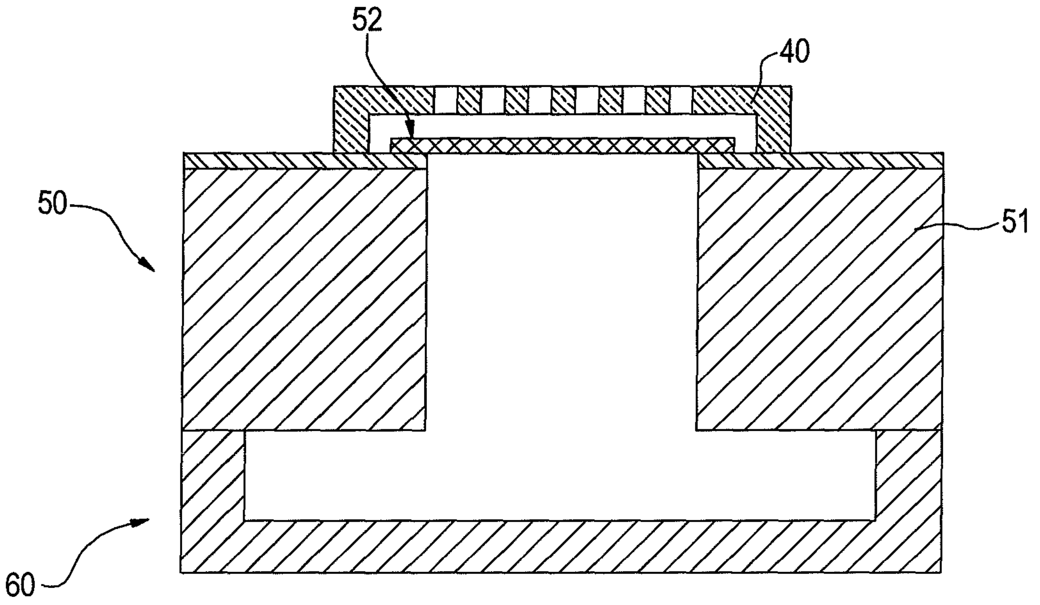
FIG. 6 is a cross-sectional view of a MEMS microphone chip according to one embodiment of the present invention.

Lastly, referring to FIG. 5, because the first substrate 21 and the second substrate 31 are made of the same material, thus a manufacturing process of wafer bonding can be applied in coupling the two chip units 20 and 30 together as a single MEMS microphone chip, and the chamber below the vibration membrane layer 22 is composed of the space 23 and the groove 32. Referring to FIG. 6, it is a cross-sectional view of a MEMS microphone chip according to one embodiment of the present invention. As shown in FIG. 6, the difference between the current embodiment and the embodiment of FIG. 2 lies in that: the MEMS microphone chip further include a back plate 40.

In detail, the MEMS microphone chip comprises a first chip unit 50 and a second chip unit 60. A vibration membrane layer 52 is disposed on (the insulation layer of) the first substrate 51; In addition, the vibration membrane layer 52 and the back plate 40 are corresponding to each other and disposed above the first substrate 51 (such as the vibration membrane layer 52 is located on a position below the back plate 40).

Figure 7:
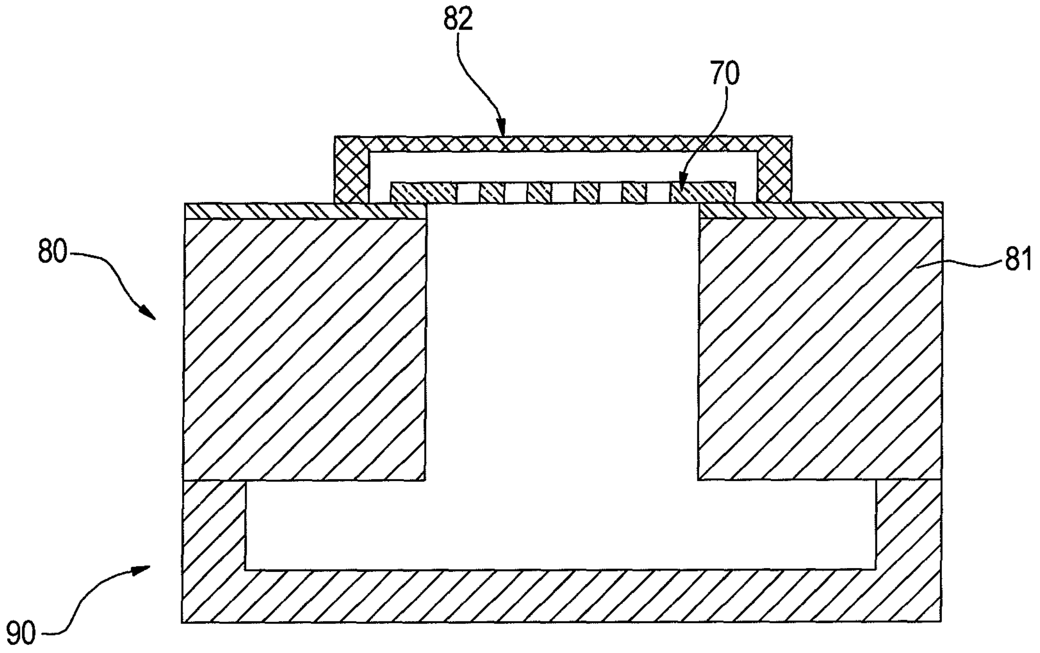
FIG. 7 is a cross-sectional view of a MEMS microphone chip according to one embodiment of the present invention.

Alternately, referring to FIG. 7, it is a cross-sectional view of a MEMS microphone chip according to one embodiment of the present invention. The difference between the current embodiment and the embodiment of FIG. 2 lies in that: the MEMS microphone chip further include a back plate 70.

In detail, the MEMS microphone chip comprises a first chip unit 80 and a second chip unit 90. A suspended back plate 70 is disposed on (the insulation layer of) the first substrate 81; In addition, the vibration membrane layer 82 and the back plate 70 are corresponding to each other and disposed above the first substrate 81 (such as the vibration membrane layer 82 is located on a position above the back plate 70).

Figure 8:
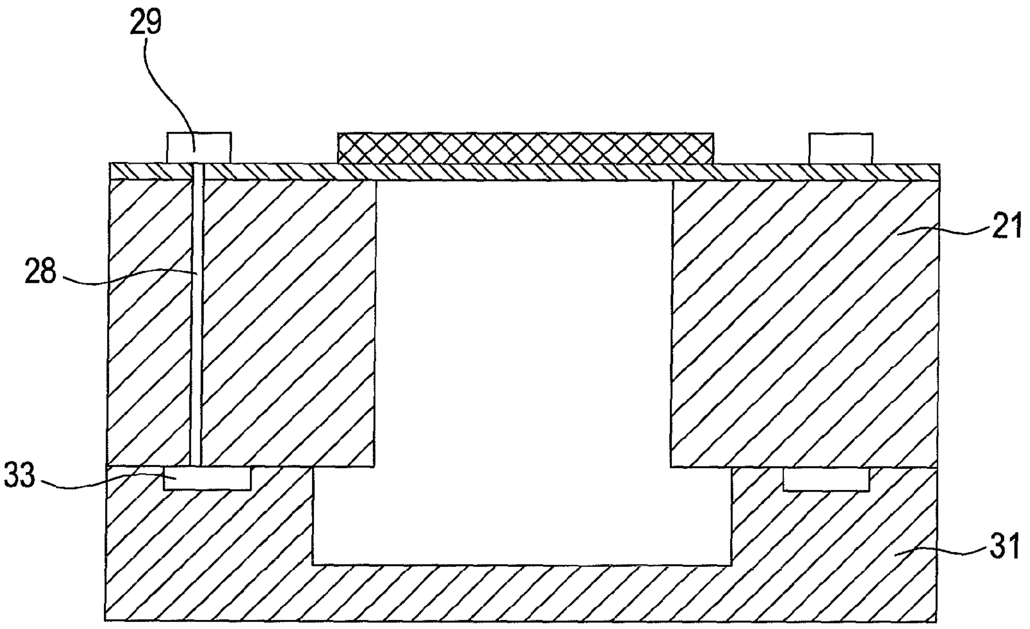
FIG. 8 is a cross-sectional view of a MEMS microphone chip according to one embodiment of the present invention.

Moreover, referring to FIG. 8, it is a cross-sectional view of a MEMS microphone chip according to one embodiment of the present invention.

Referring to FIG. 8, the difference between the current embodiment and the embodiment of FIG. 2 lies in that: the first substrate 21 further comprises a conductive pillar 28 and a pad 29; the second substrate 31 further comprises MEMS microphone chip further include an application specific integrated circuit (ASIC) 33. In detail, the ASIC 33 may be integrated within the second substrate 31, and the ASIC 33 is electrically connected to the pad 29 on the surface of the first substrate 21 through the conductive pillar 28.

In conclusion, comparing a MEMS microphone chip of the present invention with a conventional microphone chip, the chamber can be expanded and the sensitivity of the MEMS microphone chip can be enhanced, therefore an overall performance of the MEMS microphone can also be enhanced. Furthermore, because a manufacturing process of wafer bonding can be applied in coupling the substrates of the two chip units together, then single structures can be formed by cutting, thus the process has a higher degree of integration in order to avoid redundant processes. In addition, a bottom of the MEMS microphone chip is sealed because the groove of the second chip unit is not formed as an opened passage, thus a problem of adhesive leakage when the MEMS microphone chip is adhered onto a bottom plate in existing packaging process can be avoided, therefore it is more stable in a manufacturing process of the MEMS microphone chip of the present invention.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A MEMS microphone chip with an expanded back chamber, comprising:

a first chip unit having a first substrate, a vibration membrane layer being formed above a first end of the first substrate, a space being formed below the vibration membrane layer, so that the vibration membrane layer being suspended above the first substrate to vibrate; and a second chip unit having a second substrate to couple with a second end of the first substrate, and a groove being formed in the second substrate, a width of the groove being larger than a width of the space, the groove and the space being connected with each other, when the first substrate and the second substrate being coupled together, the groove and the space being combined together as a back chamber of the vibration membrane layer;

wherein the first substrate further includes a pad, and the second substrate includes an application specific integrated circuit (ASIC) and the ASIC is electrically connected to the pad.

2. The MEMS microphone chip with an expanded back chamber as claimed in claim 1, wherein the two substrates are made of silicon, and the space and the groove are formed by etching.

3. The MEMS microphone chip with an expanded back chamber as claimed in claim 1, wherein a first insulating layer and a second insulating layer are further included between the first substrate and the vibration membrane layer, and the vibration membrane layer is supported on the second insulating layer.

4. The MEMS microphone chip with an expanded back chamber as claimed in claim 3, wherein boundary columns are extended from the second insulating layer to dispose in the first insulating layer, so that an etching area of the first insulating layer can be controlled.

5. The MEMS microphone chip with an expanded back chamber as claimed in claim 3, wherein the first insulating layer is made of silicon dioxides, and the second insulating layer is made of silicon nitrides.

6. The MEMS microphone chip with an expanded back chamber as claimed in claim 1, wherein an electrode is further disposed above the first substrate to be electrically connected to the vibration membrane layer, and the MEMS microphone chip is electrically connected to an external electronic circuit via the electrode.

7. The MEMS microphone chip with an expanded back chamber as claimed in claim 1, wherein the first substrate further includes a conductive pillar, and the first substrate is penetrated in the conductive pillar and the ASIC is electrically connected to the pad through the conductive pillar.

8. The MEMS microphone chip with an expanded back chamber as claimed in claim 1, wherein the MEMS further includes a back plate, and the vibration membrane layer and the back plate are corresponding to each other and disposed on the first substrate, so that the vibration membrane layer is located on a position below the back plate.

9. The MEMS microphone chip with an expanded back chamber as claimed in claim 1, wherein the MEMS further includes a back plate, and the vibration membrane layer and the back plate are corresponding to each other and disposed on the first substrate, so that the vibration membrane layer is located on a position above the back plate.

* * * * *